United States Patent [19]

Tokumaru et al.

[11] Patent Number: 4,459,606

[45] Date of Patent: Jul. 10, 1984

[54] INTEGRATED INJECTION LOGIC SEMICONDUCTOR DEVICES

[75] Inventors: Yukuya Tokumaru; Masanori Nakai; Satoshi Shinozaki; Junichi Nakamura; Shintaro Ito; Yoshio Nishi, all of Yokohama, Japan

[73] Assignee: Tokyo Shibaura Electric Co., Ltd., Japan

[21] Appl. No.: 644,296

[22] Filed: Dec. 24, 1975

[30] Foreign Application Priority Data

Dec. 27, 1974 [JP] Japan ................. 50-1911

[51] Int. Cl.³ ............... H01L 27/04; H03K 19/091
[52] U.S. Cl. ......................... 357/44; 357/92
[58] Field of Search .............. 357/35, 36, 44, 46, 357/92

[56] References Cited

U.S. PATENT DOCUMENTS

| | | | |
|---|---|---|---|
| 3,652,347 | 3/1972 | Nagata et al. | 357/35 |
| 3,919,005 | 11/1975 | Schinella et al. | 357/35 |
| 3,922,565 | 11/1975 | Berger et al. | 357/46 |
| 3,947,865 | 3/1976 | Russell | 357/46 |
| 3,962,717 | 6/1976 | O'Brien | 357/50 |
| 3,982,266 | 9/1976 | Matzen et al. | 357/44 |
| 4,056,810 | 11/1977 | Hart et al. | 357/92 |
| 4,065,680 | 12/1977 | Russell | 357/92 |

FOREIGN PATENT DOCUMENTS 2224574 11/1972 Fed. Rep. of Germany ........ 357/44
2512737 10/1975 Fed. Rep. of Germany ........ 357/92

OTHER PUBLICATIONS

Blatt et al., IEEE IEDM, Dec. 9, 1974, Technical Digest, pp. 511–514.

Primary Examiner—William D. Larkins
Attorney, Agent, or Firm—Finnegan, Henderson, Farabow, Garrett & Dunner

[57] ABSTRACT

The integrated injection logic semiconductor device comprises an N type semiconductor substrate, a P type semiconductor layer laminated on the N type semiconductor substrate, a first N type region extending through the P type semiconductor layer to reach the N type semiconductor substrate, a P type region formed in the first N type region and having a periphery along the outer periphery of the first N type region and a second N type region formed in the P type semiconductor layer. The integrated injection logic semiconductor device is constituted by a PNP lateral transistor utilizing the P type region, the first N type region and the P type semiconductor layer as the emitter, base and collector electrodes respectively, and a NPN vertical transistor utilizing the N type semiconductor substrate, P type semiconductor layer and the second N type region as the emitter, base and collector electrodes, respectively.

5 Claims, 11 Drawing Figures

F I G. 1A 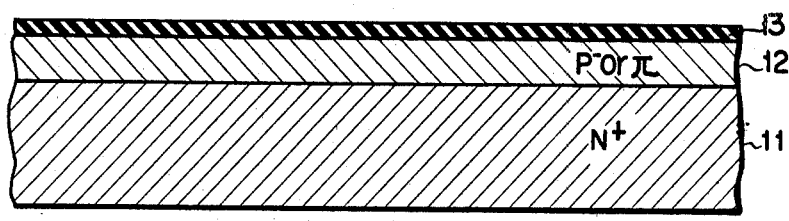
F I G. 1B 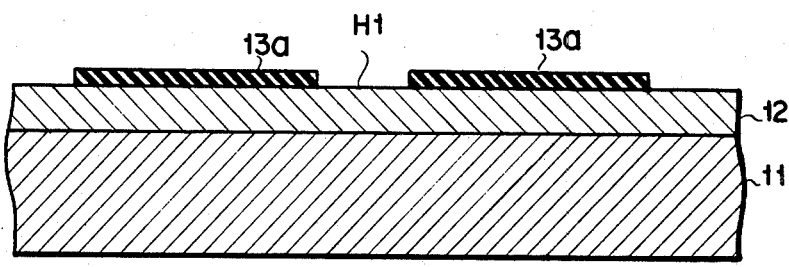
F I G. 1C 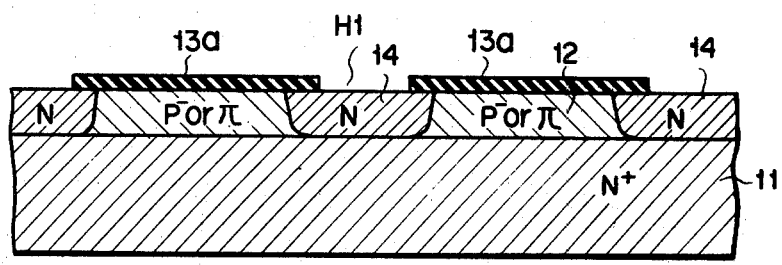
F I G. 1D 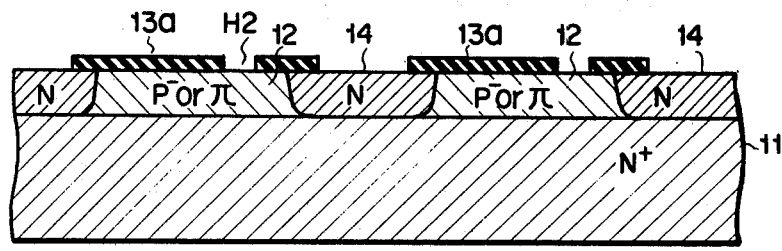
F I G. 1E 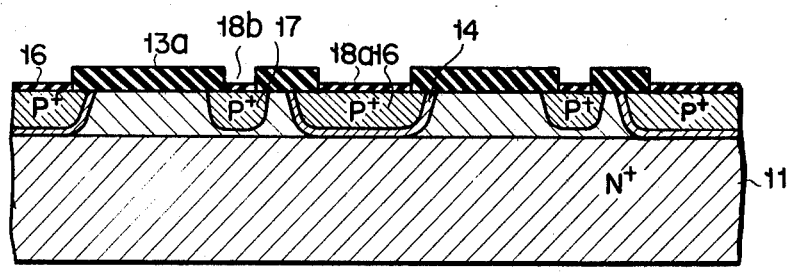

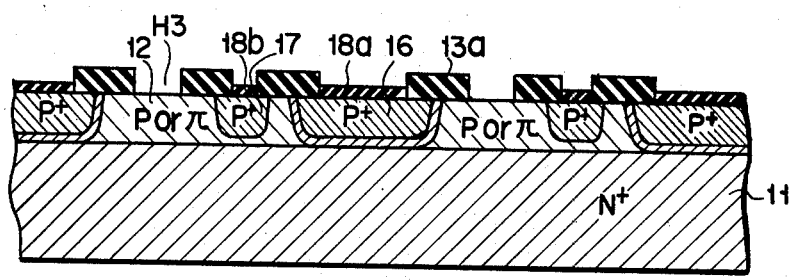
FIG. 1F
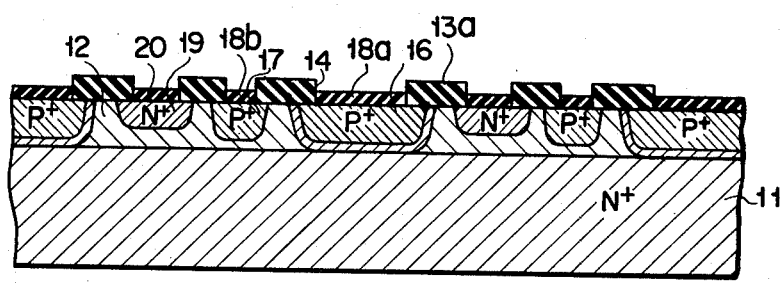
FIG. 1G
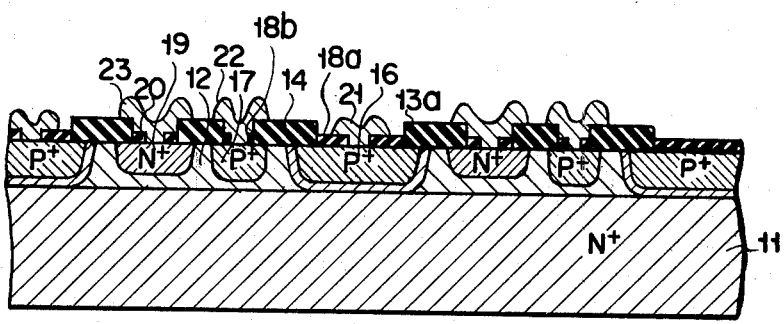
FIG. 1H
FIG. 3
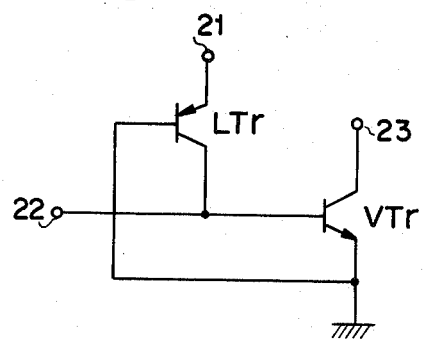
FIG. 4
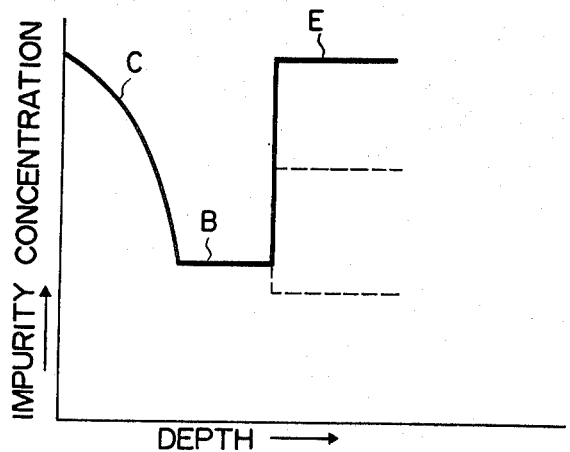

INTEGRATED INJECTION LOGIC SEMICONDUCTOR DEVICES

BACKGROUND OF THE INVENTION

This invention relates to an integrated injection logic semiconductor device.

The integrated injection logic (I²L) semiconductor device has become noted in recent years because it has such advantages that its construction is simpler, can be manufactured at higher yield, can be integrated more densely and has smaller power delay product when compared with a conventional transistor-transistor logic device. Usually, the I²L device is constructed such that a switching transistor and an injector for injecting minority carriers into the base region of the switching transistor are formed on the same semiconductor substrate and the input to the I²L device is controlled while the minority carriers are injected into the base region of the switching transistor, thereby to efficiently control the collector output of the vertical transistor which is the output of the I²L device.

In a conventional I²L semiconductor device, an N type layer of a low impurity concentration is formed by an epitaxial growth process on an N+ type semiconductor substrate of a high impurity concentration and then first and second P type regions are formed in the N⁻ type layer by diffusion. The first P type region serves as an injector region for injecting holes. An N+ region is formed in the second P type region. With this construction a PNP lateral transistor is obtained wherein the emitter, base and collector regions thereof are constituted by the first P type region, the N⁻ type layer and the second P type region, respectively, while at the same time a vertical NPN transistor is obtained wherein the emitter, base and collector regions are constituted by the N⁻ type layer, the second P type region and the N+ type region, respectively.

In this manner, since the I²L semiconductor device is constructed such that the collector region of the lateral transistor and the base region of the vertical transistor are common and that the vertical transistor operates as if the emitter and collector regions of a conventional planar transistor were interchanged, the I²L semiconductor device can not operate efficiently unless making large as far as possible the current amplification coefficient of the lateral transistor and making large the current amplification coefficient in the reverse direction of the vertical transistor. However, since the N⁻ type layer is used in common for the base region of the lateral transistor and the emitter region of the vertical transistor it is impossible to simultaneously increase the current amplification coefficients of both transistors. Moreover, since the width of the base region of the lateral transistor is increased in the direction of depth it is impossible to sufficiently increase the transfer efficiency of holes in the base region. Further, since the emitter region of the vertical transistor comprises a low impurity density N⁻ type layer, and the base region has higher impurity concentration than the emitter region, it is impossible to sufficiently improve the efficiency of carrier injection from the emitter region. As a consequence, with the prior art I²L semiconductor device described above it is impossible to improve its current amplification coefficient beyond a definite limit with the result that the power delay product increases.

SUMMARY OF THE INVENTION

Accordingly, it is an object of this invention to provide an improved integrated injection logic semiconductor device wherein the transfer efficiency and injection efficiency of minority carriers from the injector and the injection efficiency of the carriers from the emitter region of the vertical transistor are increased.

Another object of this invention is to provide an improved integrated injection logic semiconductor device capable of increasing the current amplification coefficient.

Still another object of this invention is to provide an improved integrated injection logic semiconductor device capable of increasing the switching speed, thereby decreasing the power delay product.

According to this invention there is provided an integrated injection logic semiconductor device comprising a semiconductor substrate of one conductivity type, a semiconductor layer of the opposite conductivity type laminated on the semiconductor substrate, a first one conductivity type region, said first region being formed in the semiconductor layer by diffusion and extending therethrough to reach the semiconductor substrate, an opposite conductivity type region which is formed in the first region by diffusion at the same position of diffusion as that for forming the first region, the opposite conductivity type region having a periphery along the outer periphery of the first region, and a second one conductivity type region which is formed in the semiconductor layer of the opposite conductivity type.

The opposite conductivity type region, the first one conductivity type region and the opposite conductivity type layer constitute the emitter, base and collector regions respectively of a lateral transistor, and the semiconductor substrate of the one conductivity type, the type and the second one conductivity type region constitute the emitter, base and collector regions respectively of a vertical transistor.

BRIEF DESCRIPTION OF THE DRAWING

Further objects and advantages of the invention can be more fully understood from the following detailed description taken in conjunction with the accompanying drawings, in which:

FIGS. 1A through 1H are sectional views showing successive steps of manufacturing one example of the integrated injection logic semiconductor device embodying the invention;

FIG. 3 shows an equivalent circuit of an I²L circuit element; and

FIG. 4 is a graph showing the impurity concentration profile of the vertical transistor of an integrated injection logic semiconductor device embodying the invention.

DESCRIPTION OF THE PREFERRED EMBODIMENT

Figure 2:
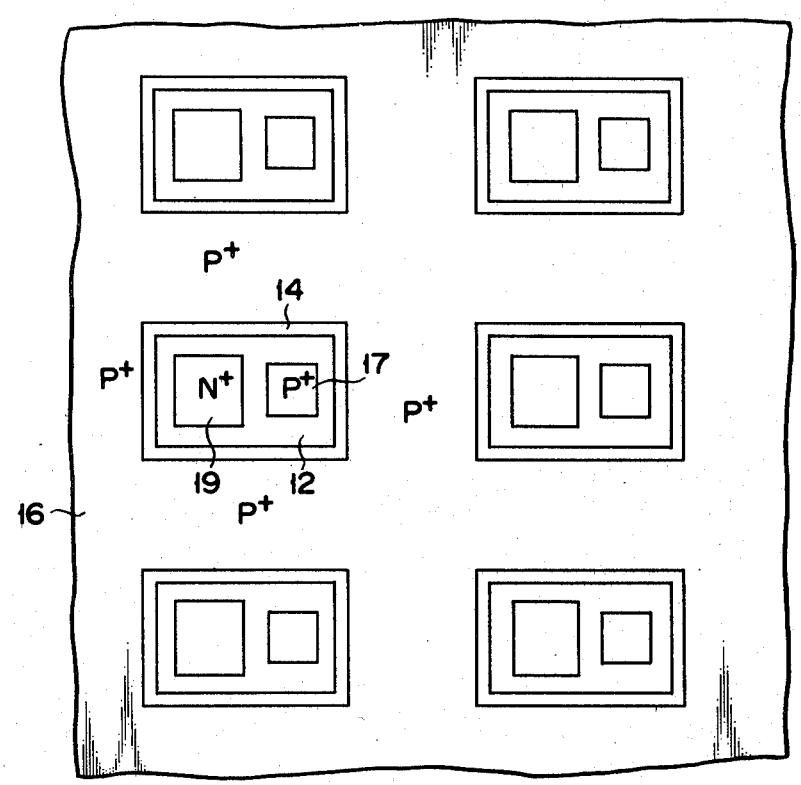
FIG. 2 shows a plane view of the I²L semiconductor device.

Before describing the integrated injection logic semiconductor device (hereinafter abbreviated as I²L semiconductor device) of this invention, the process steps of manufacturing the same will be described.

As shown in FIG. 1A, a P⁻ or π type semiconductor layer 12 is formed on an N+ type semiconductor substrate 11. The semiconductor layer 12 has much lower impurity concentration than the N+ type semiconductor substrate 11, for example, $10^{14}$ to $10^{16}$ atoms/cm$^3$, and is formed to have a thickness of about 2 to 3 μm by epitaxial growth technique utilizing boron as the impurity. A film 13 of silicon dioxide (SiO$_2$) is applied onto the semiconductor layer 12. As shown in FIG. 1B, an opening H1 of a desired pattern, for example, a grid like pattern, is formed through the SiO$_2$ film by photoetching technique.

Then an N type impurity, for example phosphorus, is heat diffused into the semiconductor layer 12 through the grid shaped opening H1 for forming N type semiconductor region 14 as shown in FIG. 1C. The temperature for effecting heat diffusion is about 1100° C. so that the N type semiconductor regions penetrate through the P type semiconductor layer 12 to reach the semiconductor substrate 11. The impurity concentration of the N type semiconductor region 14 is selected to be higher than that of the P type semiconductor layer 12, for example, to be about $10^{16}$ to $10^{18}$ atoms/cm$^3$.

Then as shown in FIG. 1D, openings H2 are formed through each of the SiO$_2$ films 13a bounded by the grid shaped opening H1. Then as shown in FIG. 1E a P type impurity, for example boron, is heat diffused in high temperature oxidizing atmosphere into the P$^-$ type layer 12 and the N type region 14 respectively through the openings H2 and the openings H1 which have been used to form the N type region 14 thereby forming first and second P+ type regions 16 and 17 respectively in the N type region 14 and the P$^-$ type layer 12. The diffusion temperature at this temperature is 1050° C., for example, and the depth of diffusion is 1 to 2 μm. The first P+ region 16 is formed along the outer periphery of the N type region 14. The first P+ region 16 formed in this manner is used as an injector region whereas the second P+ region 17 is used to act as a contact region for making an ohmic contact to the base region of the vertical transistor. After forming the first and second P+ regions 16 and 17 the openings H1 and H2 are closed by insulating films 18a and 18b, respectively. It is not necessary to form the N type region 14 and the P+ type regions 16 and 17 always by diffusion technique, but they can be formed by other technique, for example, ion implantation technique.

Next, as shown in FIG. 1F, openings H3 are formed through respective SiO$_2$ films 13a and phosphorus acting as an N type impurity is heat diffused in high temperature oxidizing atmosphere into the P$^-$ type semiconductor layer 12 through the openings H3 to form N+ type region 19 in the P$^-$ type semiconductor layer 12 as shown in FIG. 1G. These N+ type regions 19 are used as the collector regions of the vertical transistors. Thereafter SiO$_2$ films 20 are deposited on the exposed surfaces of the N+ type regions 19 through the openings H3. Although in this example, the vertical transistor is constructed so that one collector region 19 is provided in the base region 12 it is also possible to provide a plurality of collector regions 19 in a corresponding base region. Finally, as shown in FIG. 1H, openings are formed through SiO$_2$ films 18a, 18b and 20, respectively and electrodes 21, 22 and 23 are provided for the P+ regions 16 and 17 and the N+ region 19 by the vapour deposition of aluminum and aluminum patterning through these openings. The connection of the lead wires to the semiconductor substrate 11 may be made on the upper or lower surface thereof or on other portion. FIG. 2 shows a plane view of such I$^2$L semiconductor device viewed from the surface of the semiconductor layer 12.

The I$^2$L semiconductor device fabricated as above described includes a plurality of I$^2$L circuit elements each comprising a lateral transistor LTr having an emitter, base and collector respectively constituted by the first P+ type region, the N type region 14 and the P$^-$ type layer 12, and a vertical transistor VTr having an emitter, base and collector respectively constituted by the N+ type semiconductor substrate 11, the P$^-$ type semiconductor layer 12 and the N+ type region 19. FIG. 3 shows an equivalent circuit of the I$^2$L circuit element.

I$^2$L circuit element operates as follows. While the emitter region 11 of the vertical transistor VTr is maintained at zero potential (earth potential), a positive 0.8 V is impressed upon the injector 16 and the electrode 22 connected to the base of the vertical transistor acting as the input to the I$^2$L circuit element is at a binary "1" level or in a state wherein the base electrode is OFF or applied with a suitable positive voltage higher than the threshold voltage of the emitter grounded NPN type vertical transistor. Under these conditions, the holes injected into the base region 14 from the injector 16 (the emitter region of the lateral transistor LTr) reach the collector region 12 through the base region 14 whereby the number of the holes in the collector region 12 becomes excessive. For this reason, electrons are injected into the base region of the vertical transistor which is common to the collector region 12, thus forwardly biasing the base-emitter junction of the vertical transistor VTr. As a consequence, the vertical transistor VTr is turned ON and its collector region 19 assumes substantially zero potential. On the other hand, when the electrode 22 is at a binary "0" level or zero potential (earth potential), the NPN type vertical transistor is rendered OFF thus causing the collector 19 of the vertical transistor constituting the output of the I$^2$L element to have a positive potential. That is to say, the I$^2$L element operates as an inverter which produces a binary "0" output when the input is a binary "1" whereas a binary "1" output when the input is a binary "0".

As has been described above, according to this invention so-called self alignment method is used wherein the injector region 16 is formed in the base region 14 by a dual diffusion technique and the injector region 16 is formed through the opening H1 of the SiO$_2$ film which has been used to form the base region 14. Accordingly, it is possible to form the base region of the lateral transistor to have a uniform width in the direction of depth and to form a sufficiently deep injector region by diffusion thereby to form a base region having an extremely narrow width. Furthermore, it is possible to accurately control the width of the base region during the diffusion process. As a result, the transfer efficiency and the injection efficiency of the minority carriers injected from the injectors are greatly improved. As can be clearly noted from the impurity concentration profile of the vertical transistor shown in FIG. 4 in which lines C, B and E show the collector, base and emitter, since the base region 12 is formed to have an extremely low impurity concentration, the N type semiconductor substrate 11 acting as the emitter region has extremely higher impurity concentration than the base region 12, and moreover the impurity concentration of the base region is unform, it is possible not only to improve the injection efficiency of the carriers injected from the emitter region 11 but also to improve the transfer efficiency of the holes in the base region. This results in the increase of the current amplification coefficient. Further, since the impurity concentration of the base region 12 is extremely lower than that of the emitter region 11 the capacitance of the base-emitter junction is small thereby increasing the switching speed. This greatly decreases the power delay product.

Although in the foregoing example, an N type semiconductor substrate was used, it is also possible to use a P type semiconductor substrate, in which case the conductivity types of other semiconductor layer and regions are to be inverted. Further, although the I²L semiconductor device illustrated in the embodiment comprises a plurality of I²L circuit elements or transistors, it should be understood that the I²L semiconductor device may comprise only one I²L circuit element.

What we claim is:

1. An integrated injection logic semiconductor device comprising a semiconductor substrate of one conductivity type, a semiconductor layer of the opposite conductivity type laminated on said semiconductor substrate and having a lower impurity concentration than the substrate, said semiconductor layer having an oxide mask applied thereto and having a grid shaped opening in the oxide mask, a grid-shaped double diffusion region composed of one conductivity type semiconductor region formed in a grid shape in said semiconductor layer of the opposite type by diffusion through the grid shape opening of said oxide mask and extending to said semiconductor substrate, and an opposite conductivity type region formed in said first region by diffusion through the same opening of said oxide mask, thereby to isolate by means of said grid-shaped double diffusion region at least one portion of the semiconductor layer of the opposite conductivity type, and at least one second region of one conductivity type formed in said at least one portion of said semiconductor layer, whereby said grid-shaped double diffusion region and said opposite conductivity type semiconductor layer constitute a lateral transistor of one polarity type, and said one conductivity type semiconductor substrate, said opposite conductivity type semiconductor layer and said second one conductivity type region constitute a vertical transistor of opposite polarity type.

2. The integrated injection logic semiconductor device according to claim 1 wherein an ohmic contact region of the opposite conductivity type is formed in each of said at least one semiconductor layer portion.

3. The integrated injection logic semiconductor device according to claim 1 wherein said semiconductor layer of the opposite conductivity type has an extremely lower impurity concentration than said semiconductor substrate of said one conductivity type, and said first one conductivity type region has a higher impurity concentration than said semiconductor layer of the opposite conductivity type.

4. An integrated injection logic semiconductor device comprising an N type semiconductor substrate, a P type semiconductor layer laminated on said N type semiconductor and having a lower impurity concentration than the N type semiconductor substrate, said semiconductor layer having an oxide mask applied thereto, and having a grid-shaped opening in said mask, a first N type region formed in a grid-shape in said P type semiconductor layer by diffusion through the grid-shape opening of said oxide mask and extending to said semiconductor substrate a P type region formed in said first N type region by diffusion through the same opening in the oxide mask, thereby to isolate at least one portion of the P type semiconductor layer, and at least one second N type region formed in said at least one portion of said semiconductor layer defined by said first grid shape N type region, whereby said P type region, said first N type region and said P type semiconductor layer constitute a lateral PNP transistor and said N type semiconductor substrate, said P type semiconductor layer and said second N type region constitute a vertical NPN transistor.

5. An integrated injection logic semiconductor device according to claim 4, wherein said P type semiconductor layer has an extremely lower impurity concentration than said N type semiconductor substrate and said first N type region has a higher impurity concentration than said P type semiconductor layer.

* * * * *